(12) United States Patent
Tong

(10) Patent No.: US 7,862,885 B2
(45) Date of Patent: *Jan. 4, 2011

(54) METHOD OF ROOM TEMPERATURE COVALENT BONDING

(75) Inventor: Qin-Yi Tong, Durham, NC (US)

(73) Assignee: Ziptronix, Inc., Morrisville, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/958,071

(22) Filed: Dec. 17, 2007

(65) Prior Publication Data

US 2008/0187757 A1    Aug. 7, 2008

Related U.S. Application Data

(60) Continuation of application No. 11/442,394, filed on May 30, 2006, now Pat. No. 7,335,996, which is a division of application No. 10/440,099, filed on May 19, 2003, now Pat. No. 7,109,092.

(51) Int. Cl.
*B32B 15/04* (2006.01)
*B32B 18/00* (2006.01)
*B32B 33/00* (2006.01)

(52) U.S. Cl. .................... 428/212; 428/457; 428/702

(58) Field of Classification Search .................. None
See application file for complete search history.

(56) References Cited

U.S. PATENT DOCUMENTS

| | | | |
|---|---|---|---|
| 5,266,412 A * | 11/1993 | Bartak et al. | 428/472 |
| 5,407,506 A | 4/1995 | Goetz et al. | |
| 5,420,043 A * | 5/1995 | Niwa | 438/96 |
| 5,427,638 A | 6/1995 | Goetz et al. | |
| 6,080,487 A | 6/2000 | Coggio et al. | |
| 6,440,878 B1 | 8/2002 | Yang et al. | |
| 6,563,133 B1 | 5/2003 | Tong | |
| 7,041,178 B2 | 5/2006 | Tong et al. | |
| 7,335,996 B2 * | 2/2008 | Tong | 257/782 |

FOREIGN PATENT DOCUMENTS

JP    09148321 A  *  6/1997

OTHER PUBLICATIONS

Machine translation of JP 09-148321A, Jun. 1997.*
English translation of JP 09-148,321 (Jun. 1997).*
MatWeb siica data sheet (Nov. 2009).*
European Search Report.

* cited by examiner

*Primary Examiner*—Ramsey Zacharia
(74) *Attorney, Agent, or Firm*—Oblon, Spivak, McClelland, Maier & Neustadt, L.L.P.

(57) ABSTRACT

A method of bonding includes using a bonding layer having a fluorinated oxide. Fluorine may be introduced into the bonding layer by exposure to a fluorine-containing solution, vapor or gas or by implantation. The bonding layer may also be formed using a method where fluorine is introduced into the layer during its formation. The surface of the bonding layer is terminated with a desired species, preferably an $NH_2$ species. This may be accomplished by exposing the bonding layer to an $NH_4OH$ solution. High bonding strength is obtained at room temperature. The method may also include bonding two bonding layers together and creating a fluorine distribution having a peak in the vicinity of the interface between the bonding layers. One of the bonding layers may include two oxide layers formed on each other. The fluorine concentration may also have a second peak at the interface between the two oxide layers.

29 Claims, 14 Drawing Sheets

METHOD OF ROOM TEMPERATURE COVALENT BONDING

CROSS-REFERENCE TO RELATED APPLICATIONS

This application is a continuation of and claims the benefit of priority under 35 U.S.C. §120 from U.S. Ser. No. 11/442,394, filed May 30, 2006, now U.S. Pat. No. 7,335,996, which is a division of U.S. Ser. No. 10/440,099, filed May 19, 2003, now U.S. Pat. No. 7,109,092, the entire contents of which are incorporated herein by reference.

BACKGROUND OF THE INVENTION

1. Field of the Invention

The present invention relates to the field of wafer direct bonding at room temperature, and more particularly to the bonding of substrates for the fabrication of engineered substrates, encapsulation, and three-dimensional device integration using the effects of, and combined effects of, fluorine and ammonium in dielectrics, especially in a silicon oxide layer.

2. Description of the Related Art

As the physical limits of conventional CMOS device are being approached and the demands for high performance electronic systems are imminent, system-on-a chip (SOC) is becoming a natural solution of the semiconductor industry. For system-on-a chip preparation, a variety of functions are required on a chip. While silicon technology is the mainstay technology for processing a large number devices, many of the desired circuit and optoelectronic functions can now best be obtained from individual devices and/or circuits fabricated in materials other than silicon. Hence, hybrid systems which integrate non-silicon based devices with silicon based devices offer the potential to provide unique SOC functions not available from pure silicon or pure non-silicon devices alone.

One method for heterogeneous device integration has been the hetero-epitaxial growth of dissimilar materials on silicon. To date, such hetero-epitaxial growth has realized a high density of defects in the hetero-epitaxial grown films, largely due to the mismatches in lattice constants between the non-silicon films and the substrate.

Another approach to heterogeneous device integration has been wafer bonding technology. However, wafer bonding of dissimilar materials having different thermal expansion coefficients at elevated temperature introduces thermal stresses that lead to dislocation generation, debonding, or cracking. Thus, low temperature bonding is desired. Low temperature bonding is also desired for the bonding of dissimilar materials if the dissimilar materials include materials with low decomposition temperatures or temperature sensitive devices such as, for example, an InP heterojunction bipolar transistor or a processed Si device with ultrashallow source and drain profiles.

The design of processes needed to produce different functions on the same chip containing different materials is difficult and hard to optimize. Indeed, many of the resultant SOC chips (especially those at larger integration size) show a low yield. One approach has been to interconnect fully processed ICs by wafer adhesive bonding and layer transfer. See for example Y. Hayashi, S. Wada, K. Kajiyana, K. Oyama, R. Koh, S Takahashi and T. Kunio, Symp. VLSI Tech. Dig. 95 (1990) and U.S. Pat. No. 5,563,084, the entire contents of both references are incorporated herein by reference. However, wafer adhesive bonding usually operates at elevated temperatures and suffers from thermal stress, out-gassing, bubble formation and instability of the adhesive, leading to reduced yield in the process and poor reliability over time. The adhesive may also be incompatible with typical semiconductor manufacturing processes. Moreover, adhesive bond is usually not hermitic.

Room temperature wafer direct bonding is a technology that allows wafers to be bonded at room temperature without using any adhesive resulting in a hermitic bond. It is not prone to introduce stress and inhomogeneity as in the adhesive bonding. Further, if the low temperature bonded wafer pairs can withstand a thinning process, when one wafer of a bonded pair is thinned to a thickness less than the respective critical value for the specific materials combination, the generation of misfit dislocations in the layer and sliding or cracking of the bonded pairs during subsequent thermal processing steps are avoided. See for example Q.-Y. Tong and U. Gösele, *Semiconductor Wafer Bonding: Science and Technology*, John Wiley & Sons, New York, (1999), the entire contents of which are incorporated herein by reference.

SUMMARY OF THE INVENTION

The present invention is directed to a bonding method including forming first and second bonding layers on respective first and second elements, at least one of the bonding layers comprising a fluorinated oxide layer, bringing into contact the first and second bonding layers in ambient at room temperature, and forming a bond between said first and second layers at room temperature.

Forming at least one of said bonding layers comprising a fluorinated oxide layer may include forming an oxide layer and exposing the layer to a fluorine-containing solution, vapor or gas.

The method of forming a bonded structure according to the invention may also include bonding first and second bonding layers, and forming a fluorine concentration having a first peak in the vicinity of an interface between the first and second bonding layers and a second peak in at least one of said first and second layers separated from the first peak and located a distance from the first peak. One of the bonding layers may be an oxide layer, and the method may further include introducing fluorine into the oxide layer, and forming a second oxide layer on the first oxide layer after the introducing step.

The present invention is also directed to a bonded structure having first and second elements, first and second bonding layers respectively formed on the first and second elements, the first bonding layer non-adhesively bonded to the second bonding layer and the first bonding layer comprises a fluorinated oxide. In the structure the first bonding layer may comprise a first oxide layer formed on a second oxide layer, where a fluorine concentration in the first bonding layer has a first peak located in the vicinity of an interface between the first and second bonding layers and a second peak located at an interface between the first and second oxide layers.

It is an object of the present invention to achieve a very high density of covalent bonds at room temperature in air on the surface of silicon oxide covered wafers of a wide variety of materials.

A further object of the present invention is to reduce the density of a surface silicon oxide layer having a thickness of nm to µm.

A still further object of the present invention is to enhance the diffusion rate of impurities and/moisture absorption away from a bond interface.

Another object of the present invention is to obtain a bonding layer (nm to µm in thickness) having a Fluorine concentration greater than $1 \times 10^{17}$ cm$^{-3}$ on the surface.

An additional object of the present invention is to vary the density of covalent bonds across a bonding interface over the surface of an Integrated Circuit or device pattern using standard semiconductor process(es).

Another object of the present invention is to form a low-k dielectric locally or wholly on a silicon oxide surface with a fluorination treatment by standard semiconductor process (es).

A still further object of the present invention is to create a material whose surface can be atomically terminated with a desired group such that covalent bonds are formed when two such surfaces are brought into contact at room temperature.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
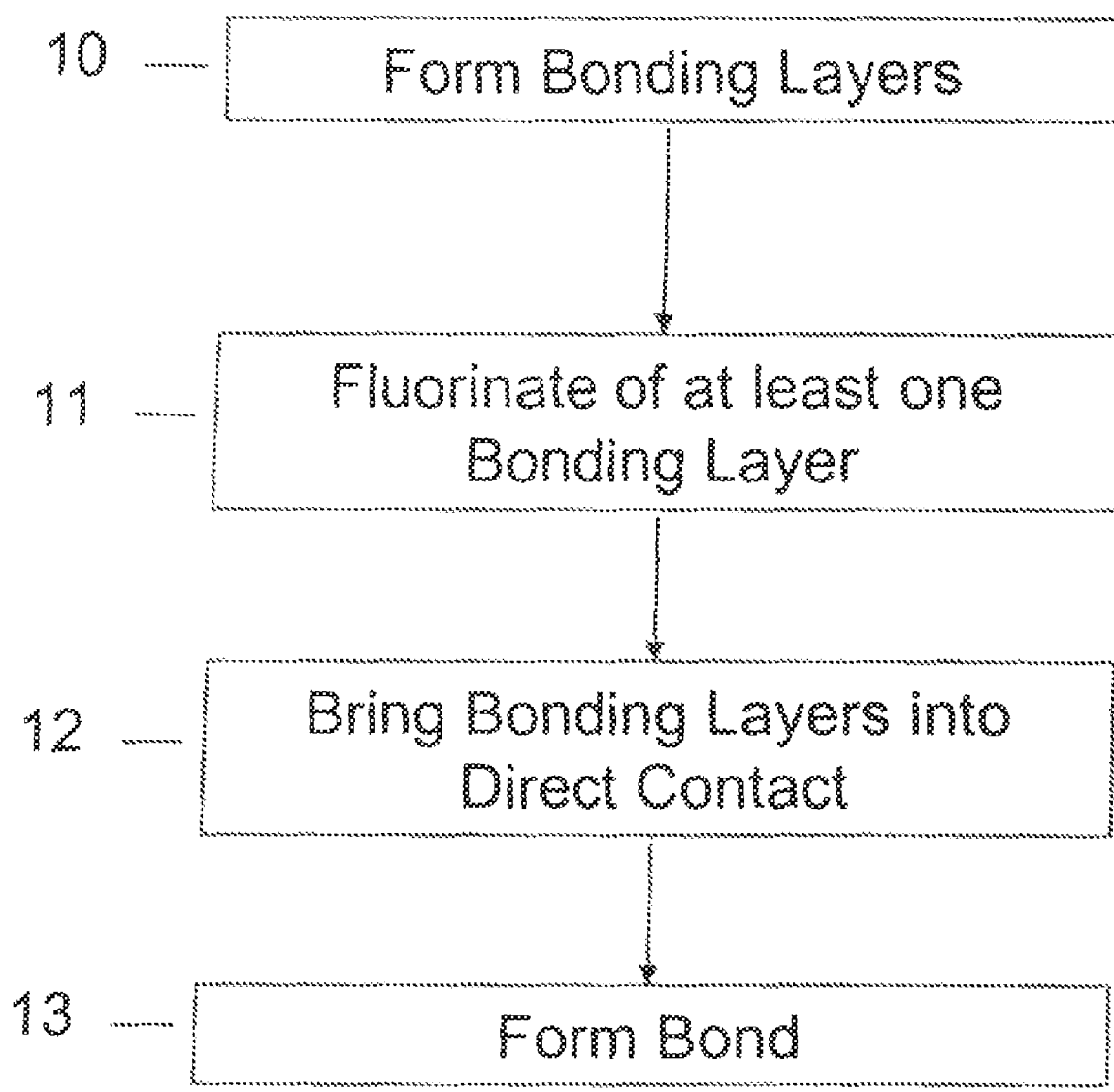
FIG. 1 is a flow diagram of an embodiment of the method according to the invention.
Figure 2A:
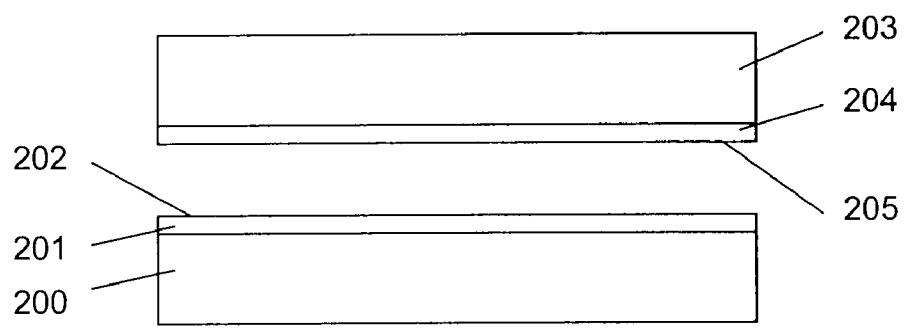
FIG. 2A is a diagram of a pair of unbonded substrates having respective bonding layers.
Figure 2B:
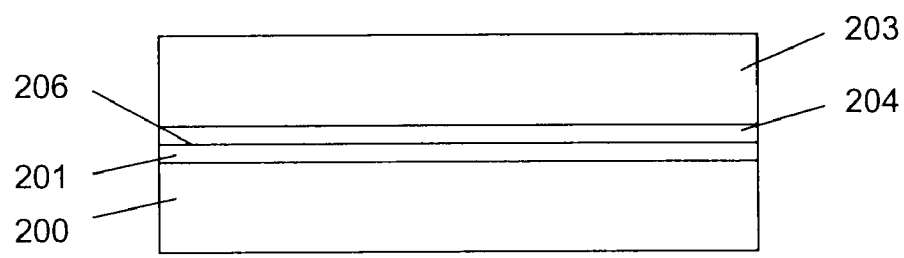
FIG. 2B is a diagram of a pair of unbonded substrates brought into direct contact.

Referring now to the drawings, wherein like reference numerals designate like or corresponding parts throughout the several views, and more particularly to FIGS. 1 and 2A-2B illustrating a first embodiment of the bonding process of the present invention is described. FIG. 1 illustrates in general terms the method according to the invention. Bonding layers are formed on an element to be bonded, such as a substrate or wafer (STEP 10). At least one of the bonding layers is fluorinated by, for example, exposing its surface to fluorine or fluorine implantation (STEP 11). The layers are brought into direct contact, forming a bonding interface, (STEP 12) and covalent bonds form as a result of a chemical reaction (STEP 13). The strength of the bond increases with time as additional covalent bonds form and/or byproducts from said chemical reaction diffuse away from said bonding interface. Preferably, the bonding process is conducted at room temperature, about 20-25° C.

FIG. 2A shows two wafers 200, 203 having respective bonding layers 201, 204 with respective opposing surfaces 202, 205. Bonding layers 201 and 204 are composed of silicon oxide formed by any one or combination of a number of techniques including but not limited to sputtering, plasma enhanced chemical vapor deposition or thermal oxide. The surfaces of materials 201 and 204 may be relatively rough (>20 Å RMS) and require smoothing before being brought into direct contact. The film also may have sufficiently low surface roughness to bond without smoothing. Surfaces 202 and 205 may be prepared utilizing techniques described in application Ser. Nos. 09/410,054, 09/505,283 and 09/532,886, to produce a smooth, activated surface. In brief, the surfaces of the bonding layers are polished to a small surface roughness, if needed, and the bonding layers are exposed to a fluorinating treatment like dilute aqueous HF, $CF_4$ or $SF_6$ plasma treatment, $F^+$ implantation, heated, if required, to fluorinate all or a desired part of the bonding layers, activated, and terminated with desired groups on the surface. The activation and termination steps may be carried out together. Only one or both of the bonding surfaces may be so treated. The surfaces 202 and 205 are brought together into direct contact, as shown in FIG. 2B, to form a bonded structure. Covalent bonding occurs across the interface 206 at room temperature between the two surfaces 202 and 205. The strength of the bond within said bonded structure increases with time as the number of covalent bonds increase and/or reaction byproducts resulting from the bringing together of said terminated surface(s) diffuse away from said bonding surfaces after said bonding surfaces are brought into direct contact.

Example

In a first example of the first embodiment, PECVD (Plasma Enhanced Chemical Vapor Deposition) silicon dioxide was deposited on single-side polished silicon wafers at 200-250° C. The thickness of the PECVD oxide is not critical and was arbitrarily chosen as ~1.0 μm. The wafers covered with the PECVD oxide layers were polished to smooth the surfaces. AFM (Atomic Force Microscopy) was employed to determine the RMS (Root Mean Square) value of surface microroughness to be 1-3 Å. The wafers were cleaned by a modified RCA 1 ($H_2O:H_2O_2:NH_4OH=5:1:0.25$) solution and spin-dried.

The wafers were divided arbitrarily into several groups with each wafer pair in a group treated in a specific way prior to bonding. In Group I, the oxide covered wafer pairs were treated in an oxygen plasma for thirty seconds in an reactive ion etch mode (RIE) at 100 mTorr. The plasma treated wafers were dipped in CMOS grade ammonium hydroxide aqueous solution containing 35% ammonia, termed "$NH_4OH$" hereafter, before being spin-dried and bonded in air at room temperature. In Group II, the oxide covered wafers were dipped in 0.025% HF aqueous solution for 30 seconds and spin-dried. The HF concentration may vary according to the type of silicon oxide used and can be from 0.01% to 0.5%. The wafers were then heated in air at 250° C. for 2-10 h. The wafers were cleaned again in RCA 1, oxygen plasma treated, dipped in $NH_4OH$ and spin-dried before bonded in air at room temperature.

Figure 3:
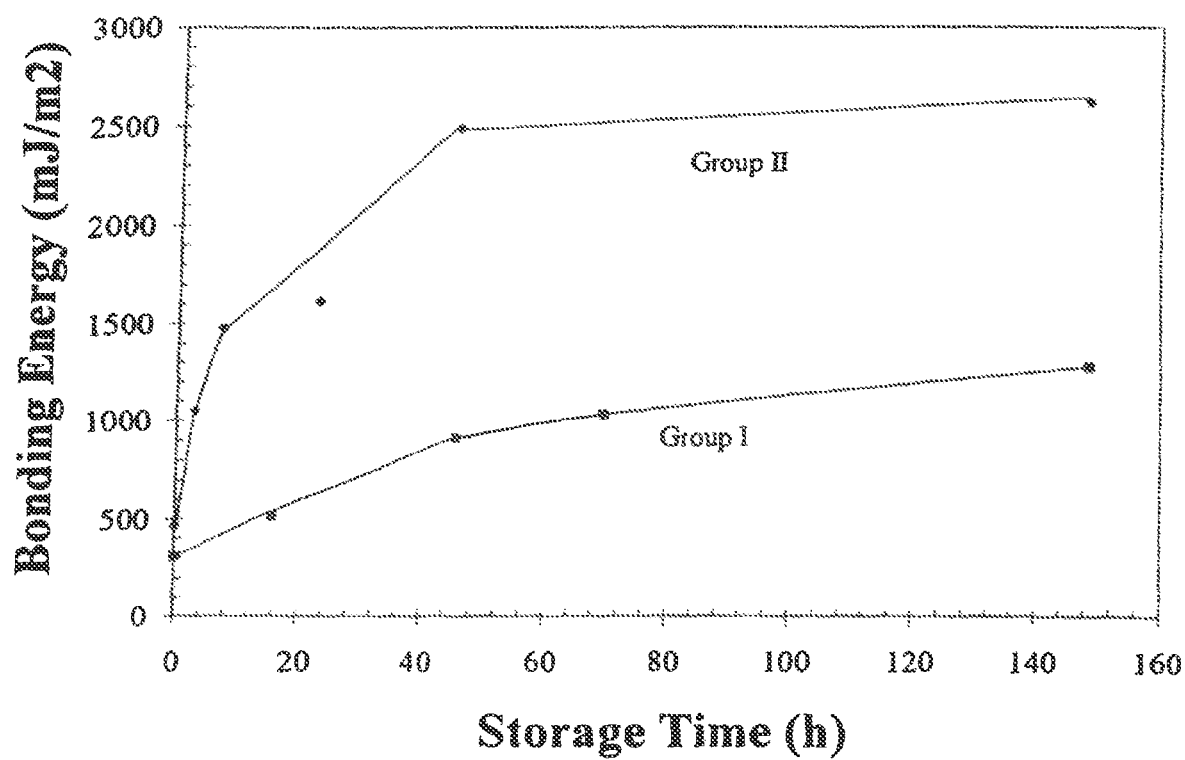
FIG. 3 is a graph of bonding energy as a function of storage time at room temperature in air of bonded wafer pairs with and without a bonding layer involving fluorine and ammonium.

FIG. 3 shows the bonding energy as a function of storage time at room temperature in air of the bonded wafer pairs of Group I and II, respectively. The bonding energy of wafer pairs in Group II increases quickly to 1000 $mJ/m^2$ within 3 hr and reaches the fracture energy of bulk silicon (2500 $mJ/m^2$) after ~40 hr storage in air at room temperature and is significantly higher than the Group I wafer pairs. This is shown by the upper curve in FIG. 3. The HF dip and subsequent heating prior to room temperature bonding produce a large difference in bonding energy at room temperature between Group I and Group II bonded wafers.

Figure 4:
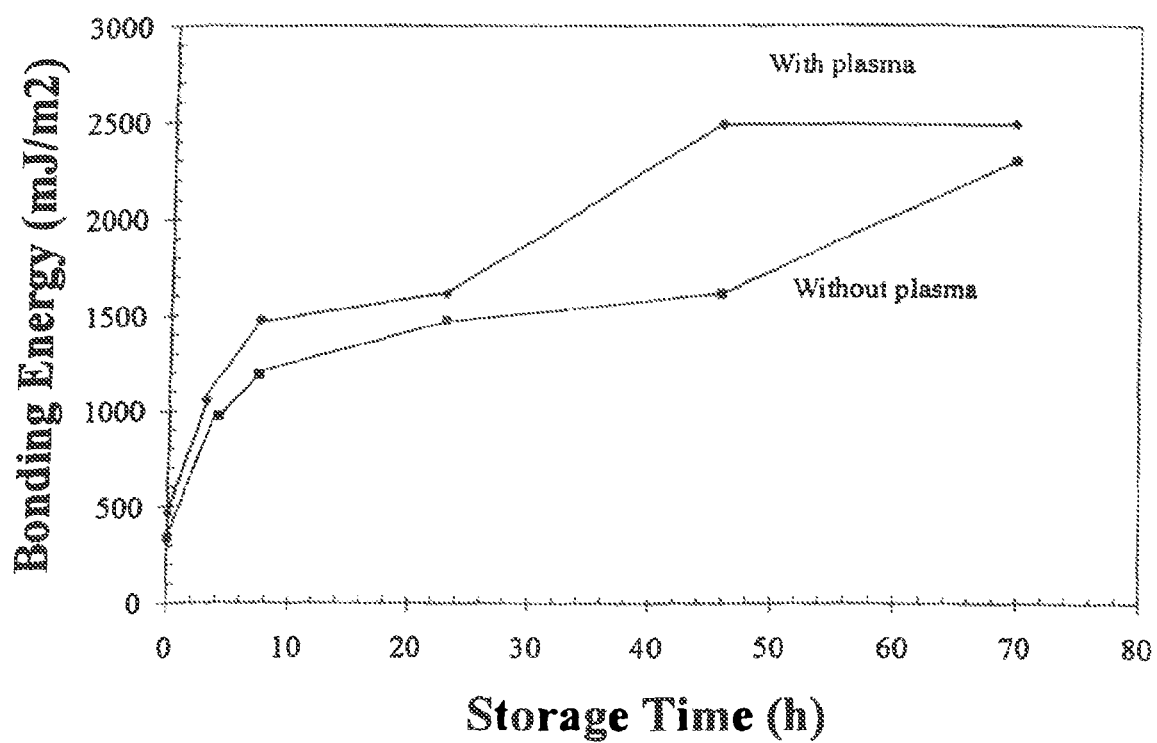
FIG. 4 is a graph of bonding energy as a function of storage time for bonded wafers processed with and without plasma treatment.

To determine the effect of the oxygen plasma treatment in enhancing the bonding energy at room temperature, another group (Group III) of wafers was prepared. The oxide covered wafer pairs in Group III were bonded at room temperature after the same process conditions as wafer pairs in Group II except that the oxygen plasma treatment step was omitted. A similar bonding energy was realized at room temperature for wafer pairs with and without plasma treatment as shown in FIG. 4. FIG. 4 indicates that the oxygen plasma treatment is not essential for the full chemical bonding at room temperature if wafer bonding is preceded by an HF aqueous dip and bake.

Figure 5:
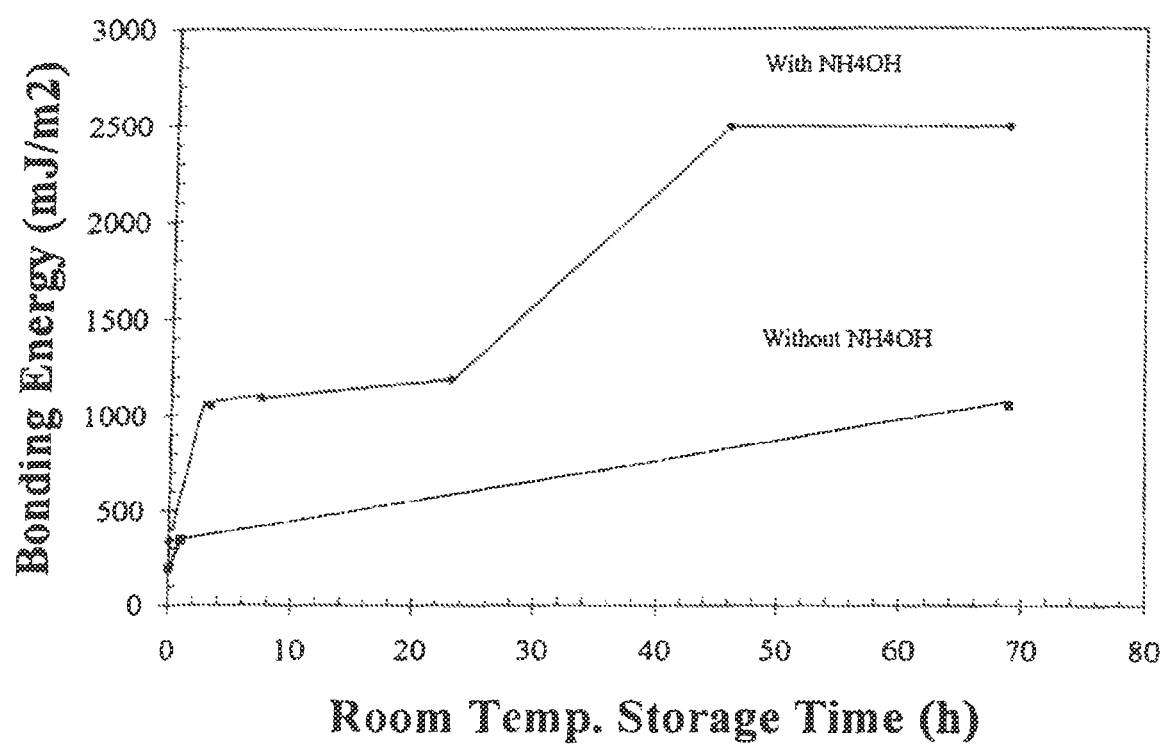
FIG. 5 is a graph of bonding energy at room temperature as a function of time for wafer pairs treated with and without ammonium.

In a further group, Group IV, the oxide covered wafer pairs were bonded at room temperature after the same process conditions as wafer pairs in Group II except that the step of $NH_4OH$ dip was eliminated and replaced by de-ionized water rinse. FIG. 5 shows that the bonding energy at room temperature is reduced by 60% for wafer pairs without $NH_4OH$ dip, 1051 $mJ/m^2$ versus 2500 $mJ/m^2$. The $NH_4OH$ dip thus significantly increases the bonding energy at room temperature.

The $NH_4OH$ treatment terminates the surface with $NH_2$ groups. Preferably, thus, in the method according to the invention $NH_2$ groups are terminated on the surface. This can be accomplished by exposure to a $NH_4OH$-containing gas, exposure to a $NH_4OH$-containing plasma, exposure to a $NH_4OH$-containing liquid vapor or exposure to a $NH_4OH$-containing liquid or combination of above treatments.

Figure 6:
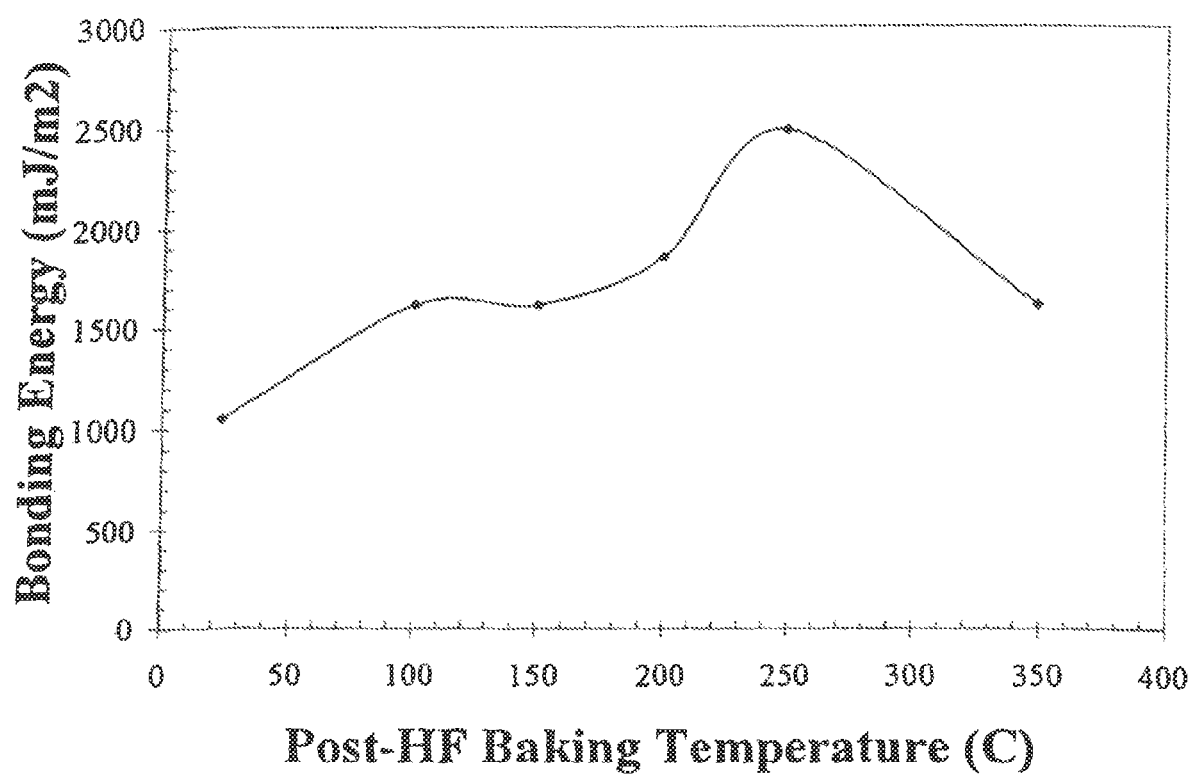
FIG. 6 is a graph of room temperature bonding energy as a function of a post-HF treatment baking temperature.

Wafer pairs were processed as those in Group II, but the post-HF baking was varied. When no baking was used and bonded wafers were stored in air at room temperature, a bond energy ~1000 $mJ/m^2$ was obtained. The increase in room temperature bonding energy as a function of a post-HF baking temperature for 10 hours of these wafer pairs is shown in FIG. 6. There is a temperature range for post-HF, pre-bonding baking in which a maximum room temperature bonding energy is achieved. The optimal results were obtained for a bake at about 250° C. Thus, in the method according to the invention the heating is preferably carried out at about 250° C.

The above results indicate, from the resultant high bond strengths, that each of the HF dip, the post-HF baking, and the $NH_4OH$ dip of the oxide-covered wafers contributes to chemical bonding at room temperature.

It is known in the art that adding fluorine into silicon dioxide can lower the oxide density and create micro-voids in the oxide network (see for example S. Lee and J-W. Park, *J. Appl. Phys.* 80(9) (1996) 5260, the entire contents of which are incorporated herein by reference). Recently, V. Pankov et al., *J. Appl. Phys.* 86 (1999) 275, and A. Kazor et al., *Appl. Phys. Lett.* 65 (1994) 1572, the entire contents of which are incorporated herein by reference, have reported that fluorine incorporation causes Si—O—Si ring breaking and changes of the silicon dioxide network structure towards large size rings with lower density via the following reaction:

$$Si-O+F \rightarrow Si-F+O+1.1 \text{ eV} \qquad (1)$$

This modified structure facilitates a higher diffusion rate of impurities and enhanced moisture absorption. Furthermore, it is well known that fluorinated silicon dioxide (SiOF) absorbs water effectively when it is exposed to humid atmosphere. V. Pankov, J. C. Alonso and A. Ortiz, *J. Appl. Phys.* 86 (1999), p. 275, the entire contents of which are incorporated herein by reference.

During a HF dip such as the dip in 0.025% HF aqueous solution of the present invention, in addition to the formation of Si—F and Si—OH groups on the silicon dioxide surface, some F ions are also generated as follows:

$$2HF+H_2O \Leftrightarrow H_3O^++HF_2^-$$

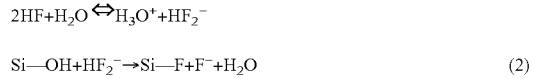

$$Si-OH+HF_2^- \rightarrow Si-F+F^-+H_2O \qquad (2)$$

See for example H. Nielsen and D. Hackleman, *J. Electrochem. Soc.* Vol. 130 (1983) p. 708, the entire contents of which are incorporated herein by reference. The post-HF baking at elevated temperatures helps remove water that is generated by the above reaction and enhances the fluorine diffusion. Fluorine atoms diffuse into the oxide and react with Si—O—Si bonds to form SiOF according to Eq. (1).

A higher temperature post-HF bake could possibly produce a thicker SiOF layer on the oxide surface leading to a higher bonding energy at room temperature due to higher efficiency of water absorption. However, the results in FIG. 6 for baking temperature up to 350° C. show that, when the post HF baking temperature is higher than 300° C., the resultant bonding energy is actually lower than that baked at lower temperatures. Chang et al., *Appl. Phys. Lett.* vol. 69 (1996) p. 1238, the entire contents of which are incorporated herein by reference, have reported that if an SiOF deposition temperature is higher than 300° C., the moisture resistance of the layer starts to increase due to loss of the fluorine atoms in the oxide. Therefore, the reduction of the bonding energy at room temperature for wafer pairs that were post-HF annealed at 350° C. prior to bonding may be attributed to the fact that the SiOF layers at the bonding interface absorb less moisture than that of 250° C. annealed layers even though the SiOF layer may be thicker.

In a preferred process of the present invention, the outermost surface termination of silicon dioxide is converted from Si—F after post-HF annealing to Si—OH after a RCA 1 solution cleaning by the exchange reaction:

$$Si-F+HOH \rightarrow Si-OH+HF \qquad (3)$$

Most Si—OH groups are then converted to Si—$NH_2$ after an, for example, aqueous $NH_4OH$ dip (that contains about 65% $H_2O$):

$$Si-OH+NH_4OH \rightarrow Si-NH_2+2HOH \qquad (4)$$

However, the surface is still partially terminated in OH groups after the $NH_4OH$ dip due to the $H_2O$ content in the $NH_4OH$.

The Si—$NH_2$ and Si—OH terminated surfaces are bonded at room temperature and the following reactions take place when the two surfaces are in sufficient proximity:

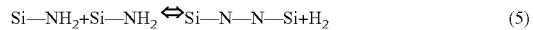

$$Si-NH_2+Si-NH_2 \Leftrightarrow Si-N-N-Si+H_2 \qquad (5)$$

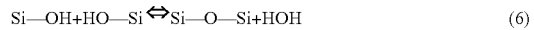

$$Si-OH+HO-Si \Leftrightarrow Si-O-Si+HOH \qquad (6)$$

For example, Q.-Y. Tong and U. Goesele, *J. Electroch. Soc.*, 142 (1995), p. 3975 have reported that Si—O—Si covalent bonds can be formed between two Si—OH groups that are hydrogen bonded on opposite bonding hydrophilic surfaces at room temperature. However, the above polymerization reaction is reversible at temperatures less than ~425° C. See for example M. L. Hair, in *Silicon Chemistry*, E. R. Corey, J. Y. Corey and P. P. Gaspar, Eds, Wiley, New York, (1987), p. 482, the entire contents of which are incorporated herein by reference.

Figure 7:
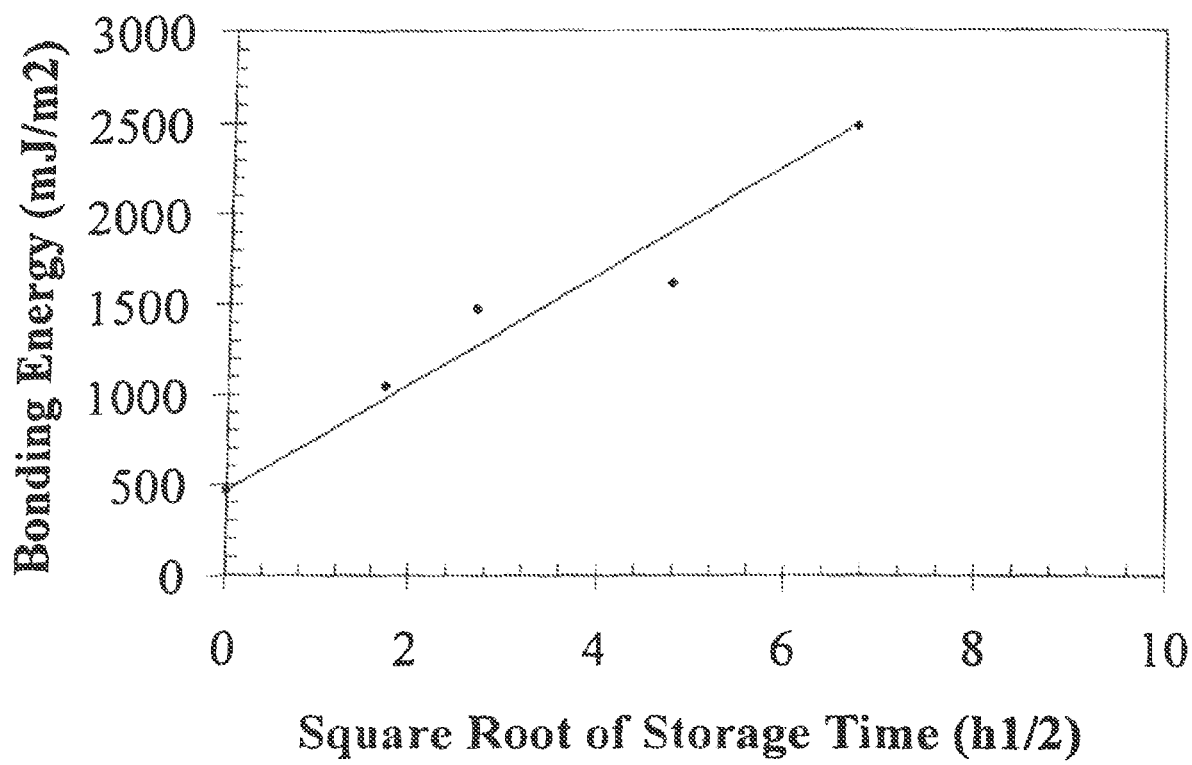
FIG. 7 is a graph illustrating the linear relation of the measured bonding energy and square root of storage time.

If the water and hydrogen generated by the above reactions can be removed without heat, the covalent bonds become not subject to reversibility according to the above reactions and permanent covalent bonding at room temperature results. According to the present invention, by fluorinating the oxide before bonding, fluorine is incorporated into the oxide away from the bonding interface and the by-product water of the above polymerization reaction can be absorbed by diffusing from the bonding interface into the low density fluorinated oxide away from the bonding interface, leading to a high degree of covalent bonding across the interface at room temperature. The bonding energy as a function of the square root of storage time at room temperature is shown in FIG. 7 for oxide covered wafer pairs bonded at room temperature using the same process conditions as those in Group II. For a constant total amount of water S, the water concentration at the bonding interface $C_{s1}$ is reversibly proportional to the square root of time t and water diffusion coefficient $D_1$ and the hydrogen concentration at the bonding interface $C_{s2}$ is reversibly proportional to the square root of time t and hydrogen diffusion coefficient $D_2$:

$$C_{s1} = S/(\pi D_1 t)^{1/2} \quad (7.1)$$

$$C_{s2} = S/(\pi D_2 t)^{1/2} \quad (7.2)$$

See for example J. C. C. Tsai, in *VLSI Technology*, S. M. Sze, Ed, McGraw-Hill, Auckland, (1983), p. 147, the entire contents of which are incorporated herein by reference.

As the bonding energy γ is reversibly proportional to the water and hydrogen concentration at the bonding interface, the bonding energy should proportional to the inverse of the hydrogen and water concentration at the interface:

$$\gamma \sim (C_{s1} + C_{s2})^{-1} \quad (8)$$

Although the concentration of $NH_2$ termination may be greater than OH termination resulting in a higher concentration of $H_2$ than $H_2O$ after bonding, the diffusivity of hydrogen is expected to be significantly higher than that of water due to its much smaller size (2.5 Å vs. 3.3 Å). The increase in bond energy may then be dominated by the diffusion of water and be proportional to the square root of time if the diffusion coefficient is a constant:

$$\gamma \sim 1/C_{s1} = (\pi D_1 t)^{1/2}/S \quad (9)$$

Consistent with this understanding, an approximate linear relation of the measured bonding energy vs. square root of storage time is observed, as shown in FIG. 7, is consistent with water (and hydrogen) diffusion away from the bonding interface into the fluorinated oxide layer. Thus, the diffusion of water (and hydrogen) away from the bond interface is likely responsible for the enhancement of the bonding energy observed in the present invention, but the present invention is not limited to reactions that result in water byproducts and the diffusion of said water (and hydrogen) byproducts away from said bond interface.

For a bonding surface that is terminated primarily with OH groups, for example one not treated with $NH_4OH$ as, for example, the wafers in Group IV, there is a substantially higher concentration of $H_2O$ to diffuse away from the interface. Therefore, the bonding energy of wafer pairs with $NH_4OH$ dip increases quickly with storage time and reaches a much higher value than that of wafer pairs without $NH_4OH$ dip as shown in FIG. 5.

Figure 8A:
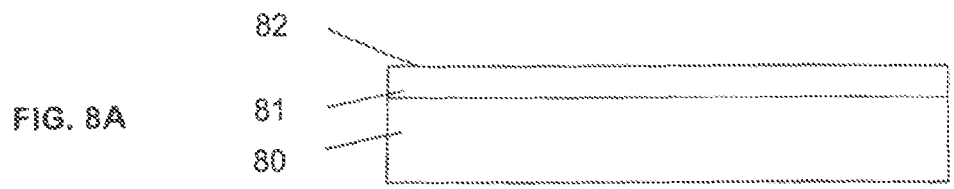
FIGS. 8A-8C illustrate an embodiment of the invention where a fluorinated layer is formed in a bonding layer.
Figure 8B:
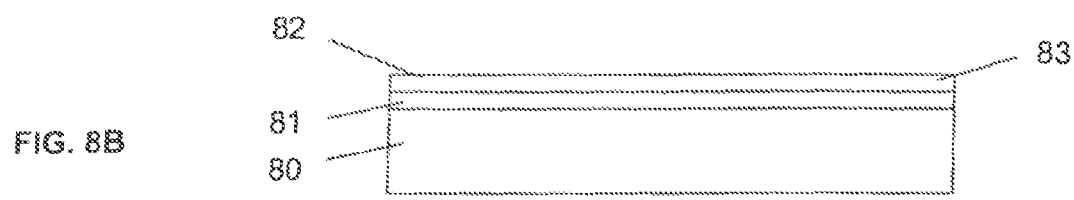
Figure 8C:
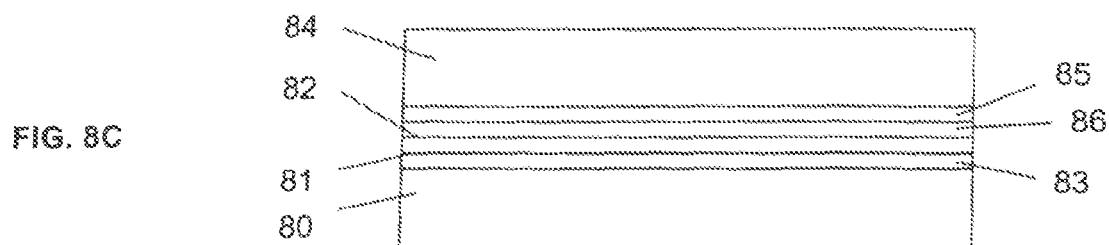

A method of fluorinating an oxide layer for use in subsequent bonding is shown in FIGS. 8A-8C. After forming an oxide layer 81 on a substrate to be bonded 90 (FIG. 9A), the oxide is exposed to HF either by a wet process or by a gaseous process. An example of a gaseous process is exposure of the wafer surface to HF vapor without immersion in an HF solution. The oxide may be formed in a number of ways including but not limited to sputtering, plasma enhanced chemical vapor deposition (PECVD), and thermal growth. The substrate may be a silicon wafer with or without devices formed therein. Alternatively, F may be introduced into the oxide layer by fluorine ion implantation of $1 \times 10^{15}$ to $1 \times 10^{16}/cm^2$ with energy of 20-30 keV.

After annealing at ~250° C. a SiOF surface bonding layer 83 of about 0.5 μm thick is formed in the surface 82 of layer 81 (FIG. 8B). It is noted that the dimensions of layer 83 are not shown to scale. The substrate is ready for bonding to another substrate 84 having a second bonding layer 85 also having an SiOF layer 86 formed in the surface, the bonding able to be performed in ambient at room temperature, as shown in FIG. 8C. A very high density of covalent bonds that is higher by a factor of up to 2.5 than pairs bonded using no HF dip and bake (as inferred by measured bond strength) is formed between the substrates at room temperature.

It is also possible to bond the SiOF surface layer to another bonding layer without an SiOF surface layer. It is also possible to form SiOF surface layers by F+ implantation and/or etching (for example dry etching using $SF_6$ and/or $CF_4$) of silicon oxide followed by baking at an elevated temperature. It is further possible to form SiOF surface layers by PECVD (Plasma-Enhanced Chemical Vapor Deposition). For example, electron-resonance PECVD oxide deposition using $SiF_4/Ar/N_2O$ at room temperature (S. P. Kim, S. K. Choi, Y. Park and I Chung, *Appl. Phys. Lett.* 79 (2001), p. 185, PECVD oxide deposition using $Si_2H_6/CF_4/N_2O$ at 120° C., J. Song, P. K. Ajmera and G. S. Lee, *Appl. Phys. Lett.* 69 (1996), p. 1876 or $SiF_4/O_2/Ar$ at 300° C. S. Lee and J. Park, *Appl. Phys. Lett.* 80 (1996), p. 5260.

Figure 9A:
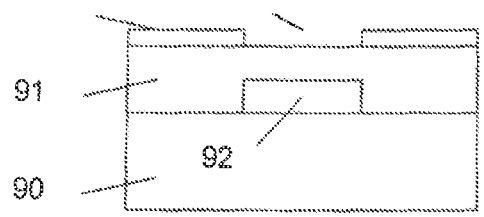
FIGS. 9A-9E show schematically localized fully covalent bonding regions in a bonded wafer pair.
Figure 9B:
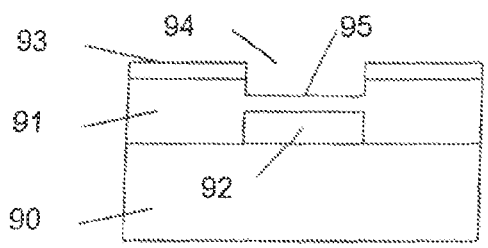
Figure 9C:
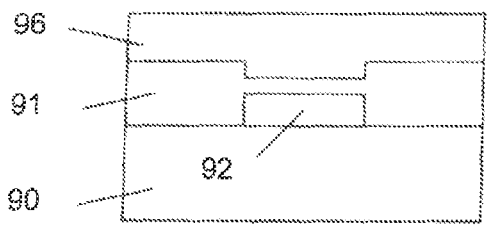

The HF-dip and annealing to form the SiOF surface bonding layer on silicon dioxide surface has unique applications. FIGS. 9A-E show schematically that the present invention can be used to produce a localized variation in covalent bonding and hence bond energy across a surface. FIG. 9A shows that, at the selected regions of exposed silicon dioxide on a silicon wafer, in this case the silicon device regions, a dilute HF (or buffered HF) solution is used to etch a small amount of oxide from the surface. Substrate 90 has a silicon dioxide layer 91 and a device portion 92. The device portion could be a discrete device, a circuit or an integrated circuit. Photoresist or masking layer 93 is formed on oxide 91 having an aperture 94. The dilute HF solution etches the silicon dioxide exposed by aperture 94 to create recessed area 95. The recessed area may have a very wide range of depth from a few nm to many microns, although thicker depths are also possible (FIG. 9B). The photoresist or masking layer is resistant to etching by HF. Layer 93 is removed, followed by, as shown in FIG. 9C, deposition of silicon dioxide at ~250° C. across the entire surface. The 250° C. re-deposition process mimics in effect the post-HF baking treating and buries the dilute HF treated surface.

Figure 9D:
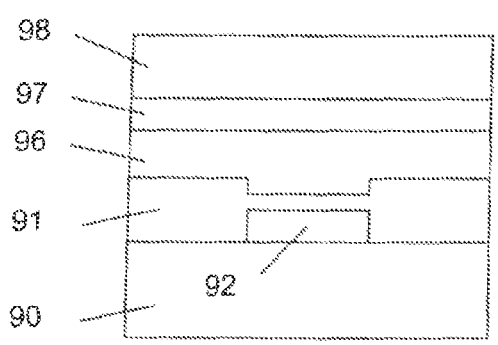

A CMP process step may then be used to planarize the recessed area and improve the surface roughness. A Group I surface treatment is then applied to layer 96, and the silicon wafer is bonded at room temperature to another wafer, such as a silicon dioxide layer 97 covering wafer 98, as shown in FIG. 9D. The room temperature bonding energy at the HF etched regions is then significantly higher than the non-HF etched regions along the bonding interface according to the present invention.

Figure 9E:
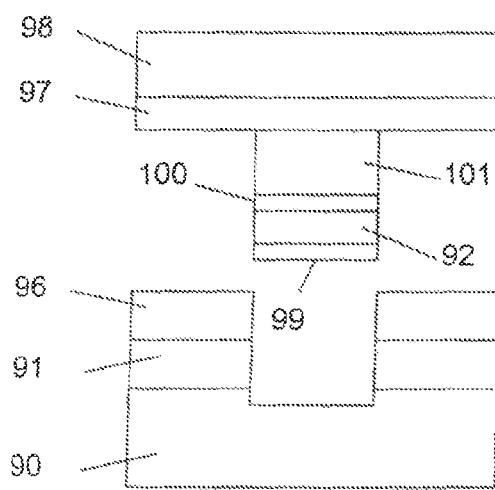

When a bonded pair so formed is forcibly separated, the resulting separation is typically not at the bonding interface of the HF dipped device region. Instead, a part of the silicon wafer or the silicon wafer itself may fracture beneath the bonded interface and peel from the substrate, as shown schematically in FIG. 9D. Portion 99 of substrate 90 is attached to device or circuit 92. Portion 100 of layer 91 and portion 101 of layer 96 are separated by the fracture (FIG. 9E).

Figure 10:
FIG. 10 is a micrograph depicting the fractured Si subsurface beneath the bonded interface of the present invention.

A physical example of the FIG. 9 schematic is shown in the micrograph of FIG. 10 that shows the remnant of a wafer from a bonded pair that was forcibly separated. This remnant shows a fracture in a silicon wafer beneath the bonded interface where the surface was exposed to HF. This is consistent with the bonding energy between silicon oxide layers in these locations being higher than the fracture energy of bulk silicon. In other locations at the bonding interface of the wafer pair, also shown in FIG. 10, the surface was not exposed to HF. In these locations, the bonding energy is expected to be lower than the fracture energy of bulk silicon. This is consistent with the lack of silicon peeling in these areas.

Figure 11:
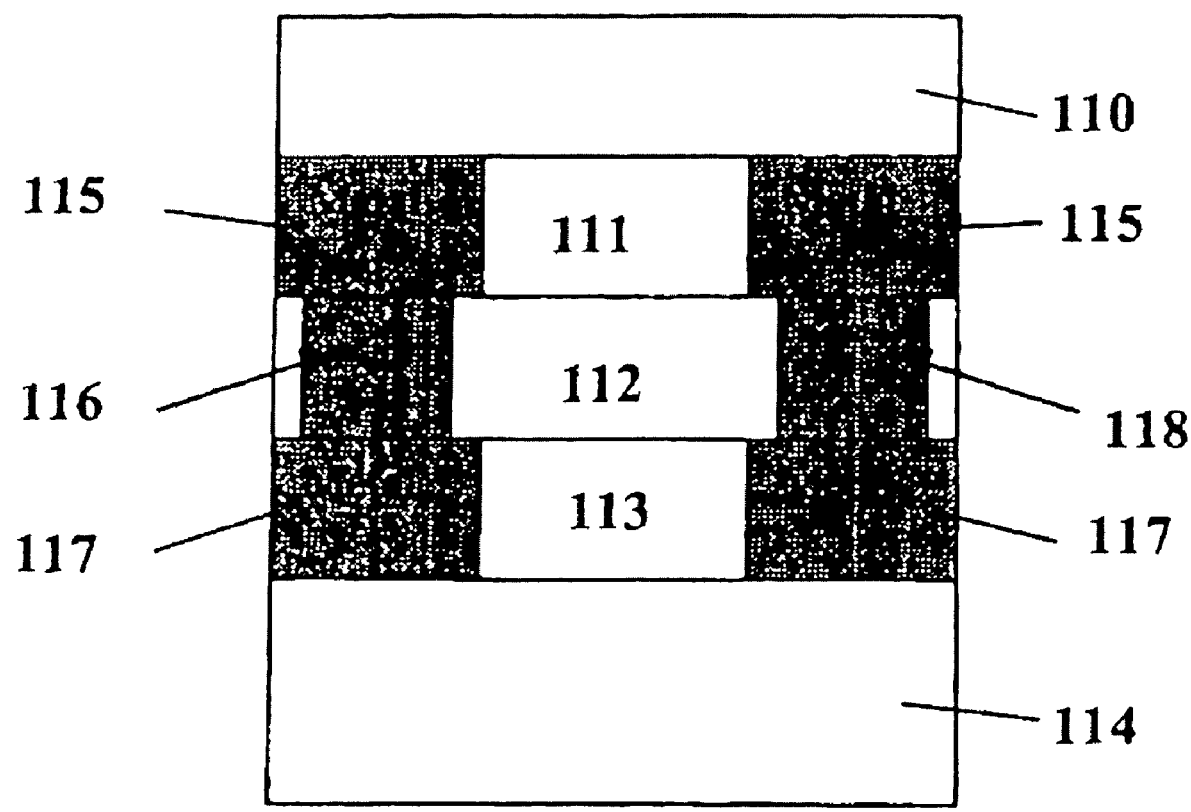
FIG. 11 is a diagram of an embedded low-k oxide structure.

This localized fluorination may also result in the formation of a lower k dielectric due to the introduction of F into the oxide which lowers the dielectric constant of the material. This feature of the present invention may be used to advantage in the design of integrated circuits or other structures. For example, a low k dielectric can be formed between the metal lines, but not at the via level in multi-layer interconnects in VLSI devices, by an etching process, such as exposure to HF, at an area where low k dielectric is desired followed by an oxide deposition at ~250° C. FIG. 11 shows an example of an embedded low k structure. In FIG. 11, low k material layer portions 111 and 113 are formed between oxide layers, such as $SiO_2$, 110, 112 and 114. Metal layers 115 and 117 are connected by vias 116 and 118.

Example

A second example of the method will be described again using FIGS. 8A-8C. A first oxide layer 81 is formed on substrate 80 (FIG. 8A). Fluorine is introduced into film 81 by one of the procedures described above, namely, exposure to HF or exposure to a F-containing gas. A second oxide film 82 is formed on film 81 by PECVD, for example (FIG. 8B). Fluorine is introduced into the second film by diffusion and/or surface segregation. It may also be introduced into the second film by the use of an appropriate F-containing precursor for the deposition of said oxide film 82. It is noted that the dimensions of films 81 and 82 are not to scale for this example, since the figures were also used to describe an example where film 82 is formed in the surface of film 81, but the figures do accurately represent the position of films 81 and 82. In this example, the structure does not need to be baked to create a fluorinated layer that assists in the removal of reaction byproducts because of the deposition temperature and/or F-containing precursor associated with said oxide film 82. The sample is then ready to be bonded to another wafer as shown in FIG. 8C.

Figure 12:
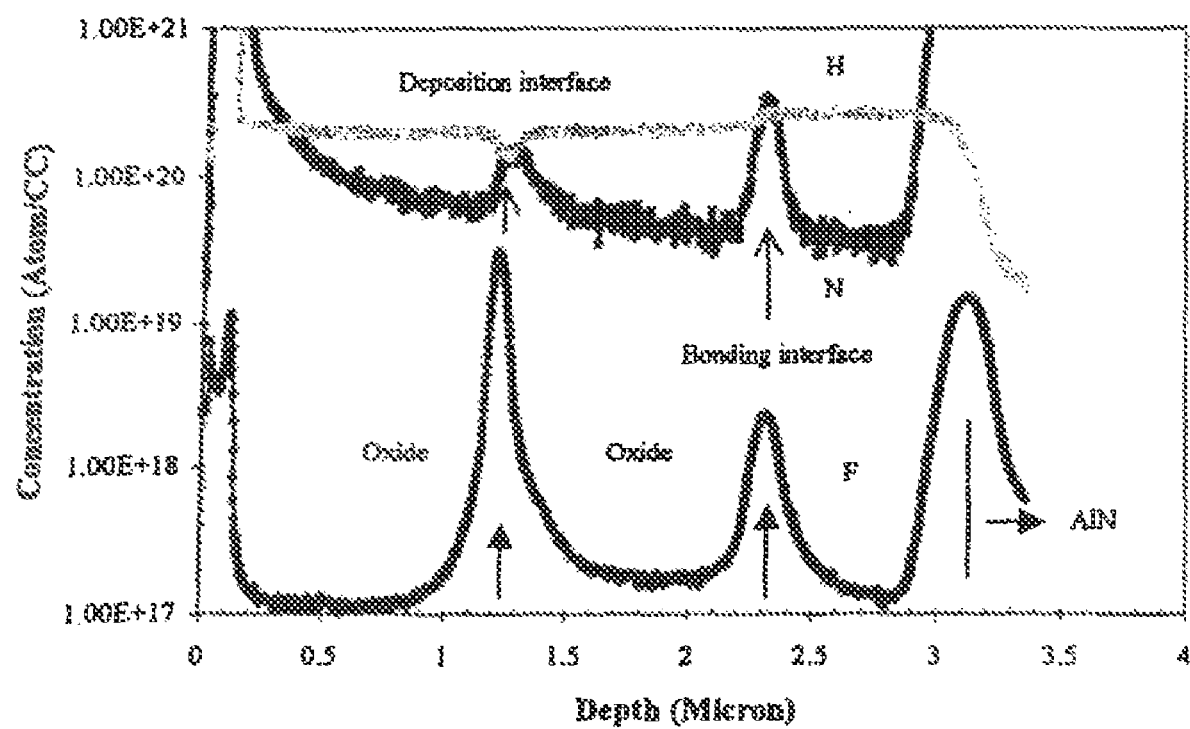
FIG. 12 is a SIMS (Secondary Ion Mass Spectroscopy) measurement.

SIMS (Secondary Ion Mass Spectroscopy) measurements were taken on the sample shown in FIG. 10 in the HF exposed surface area of the sample processed where a silicon oxide layer is formed and exposed to an HF solution, followed by deposition of oxide at 250° C. The sample was then dipped in an $NH_4OH$ solution. The measurement is shown in FIG. 12. The existence of Si—N covalent bonds at the bonding interface of bonded wafers that were dipped in $NH_4OH$ prior to bonding is confirmed by the SIMS measurement shown in FIG. 12. Furthermore, the SIMS profile measurement clearly confirms the existence of a high F concentration in the vicinity of the oxide deposition interface on the HF etched recess. Since the only HF exposure to this sample was before the oxide deposition, it is reasonable to attribute the F signal at the bonding interface to the diffusion of F through the deposited oxide and accumulation at the oxide surface during the 250° C. oxide deposition. The fluorine concentration at the bonding interface is about $2 \times 10^{18}/cm^3$ and the peak nitrogen concentration is $\sim 3.5 \times 10^{20}/cm^3$. The F located away from the bonding interface facilitates removal of reaction byproducts, such as HOH, resulting in an increased concentration of permanent covalent bonds and bond strength.

The post-HF aqueous dip bake of 10 hours at 250° C. is comparable to the temperature and duration of iterated PECVD oxide deposition. It is thus possible to avoid a separate annealing step after the HF dip by instead depositing a PECVD oxide on the HF treated surface. An example of this advantage is in the planarization of a non-planar wafer in preparation for wafer bonding. For example, the room temperature bonding can be very useful for the bonding of integrated circuits (ICs). However, ICs typically have a non-planar surface that is not conducive to the planar and smooth surfaces preferable for room temperature direct wafer bonding. A method for improving this planarity is to deposit an oxide layer followed by CMP. This is similar to the example provided above with the exception that the non-planarity may be 1 micron or more. In this case of increased non-planarity, a thicker oxide is deposited or more than one iteration of oxide deposition and CMP is used to achieve the desired planarity. In this planarization process, if the HF treatment is applied before the (last) oxide depositions, then the subsequent oxide deposition will have an increased F concentration and a F accumulation at its surface after the oxide deposition. This F concentration can then result in a higher bond energy, for example with a Group I pre-bond treatment as described above, without any post-oxide-growth heat treatment, than would otherwise be obtained if the HF treatment was not used.

The method of the present invention can be carried out in ambient conditions rather than being restricted to high or ultra-high vacuum (UHV) conditions. Consequently, the method of the present invention is a low-cost, mass-production manufacturing technology. The method is also not limited by the type of wafer, substrate or element bonded. The wafer may be a bulk material, such as silicon, a wafer having devices formed therein, a handler substrate, a heat sink, etc.

Figure 2C:
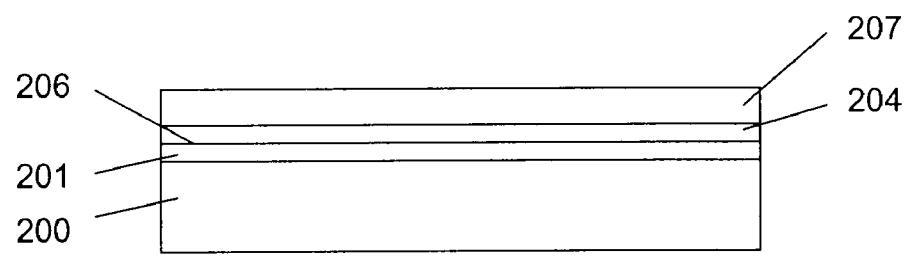
FIG. 2C is a diagram of the pair of substrates in FIG. 2B after a portion of the substrate is removed.
Figure 2D:
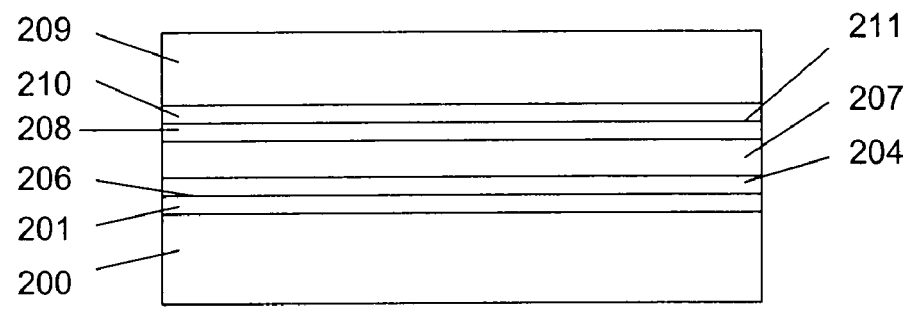
FIG. 2D is a diagram of the pair of substrates of FIG. 2C after bonding a third substrate.

While FIGS. 2A and 2B show two devices bonded together, the method is not limited to bonding two devices. One of substrate 200 and 203 may be removed and the process repeated, as shown in FIGS. 2C and 2D. In FIG. 2C the substrate 203 of the structure shown in FIG. 2B is subject to substrate removal by a procedure including one or more processes of grinding, lapping, polishing and chemical etching, to leave portion 207. The appropriate process or processes may be determined based upon the type of the materials or the structure subjected to the process or processes. In a case where the substrate 203 contains devices or other elements in its surface, all or essentially all of substrate 203 except for the region where the devices or other elements reside may be removed. The amount removed can vary based upon the materials, the etching characteristics of the materials, or the details of the particular application.

Another bonding layer 208 of the same or different material, such as a deposited silicon oxide material is formed on portion 207 (as shown in FIG. 2C) and another substrate 209 with bonding layer 210 is prepared as described above, namely, the surface of layer 210 is smoothed to a surface roughness in the above-mentioned ranges, and bonded to layer 208 at interface 211 in the same manner as described above. The resulting structure is shown in FIG. 2D. The process may be performed N times, as desired, to produce an (N+1)-integrated structure.

Figure 13:
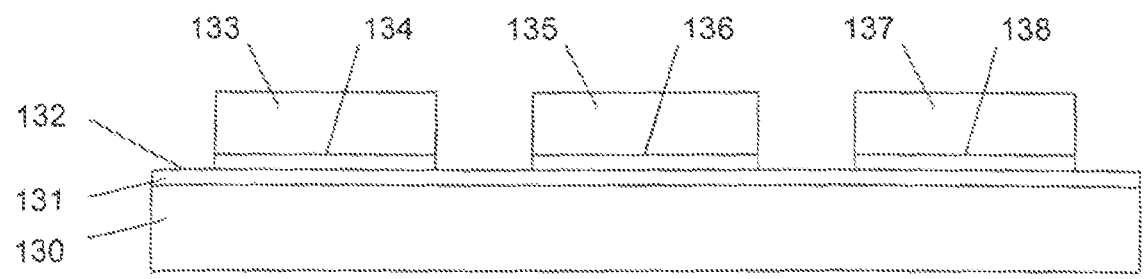
FIG. 13 illustrates bonding a plurality of devices to a larger substrate.

The present invention can bond locally or across an entire wafer surface area. In other words, smaller die may be bonded to a larger die. This is shown in FIG. 13 where several smaller die 133, 135 and 137 having respective bonding layers 134, 136 and 138 are bonded to surface 132 of bonding layer 131 formed on substrate 130.

Figure 14A:
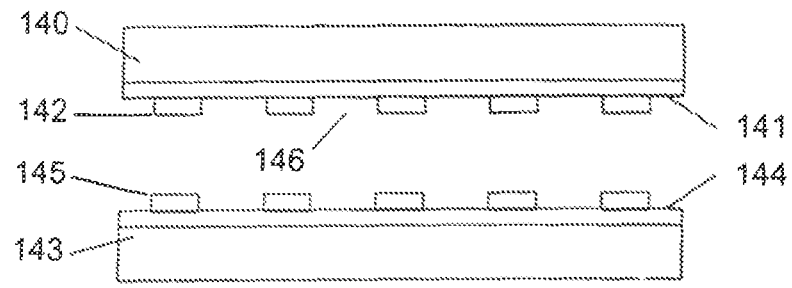
FIGS. 14A-14C depict schematically an application of the bonding process of the present invention to metal to metal bonding.
Figure 14B:
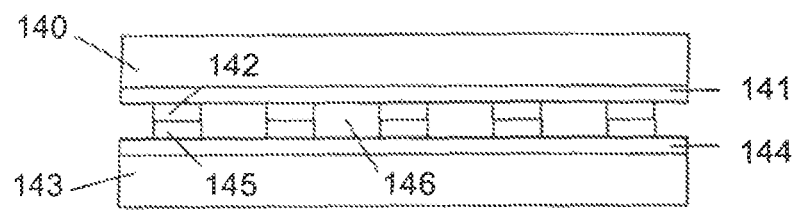
Figure 14C:
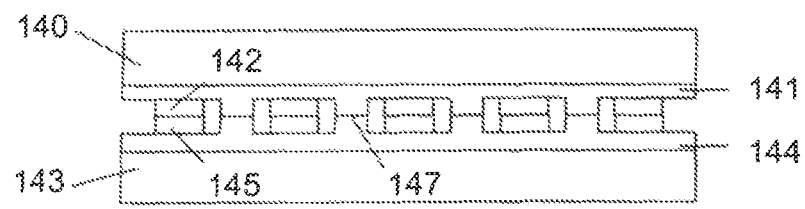

The present invention may also be used in room temperature metal direct bonding, as described in application Ser. No. 10/359,608, the contents of which are herein incorporated by reference. As shown in FIG. 14A, two substrates 140 and 143 have respective bonding layers 141 and 144 and metal pads 142 and 145. Gaps 146 separate the pads and the upper surfaces of the pads extend above the upper surface of the layers 141 and 144. The surface of layers 141 and 144 are prepared for bonding as discussed above, and then the metal pads of the substrates are brought into contact (FIG. 14B). At least one of the substrates elastically deforms and the bonding layers 141 and 144 contact and begin to bond at one or more points of contact between the layers 141 and 144 (FIG. 14C). The bond propagates to form a bond 147. At room temperature, a strong bond (such as a covalent bond) forms.

Figure 15:
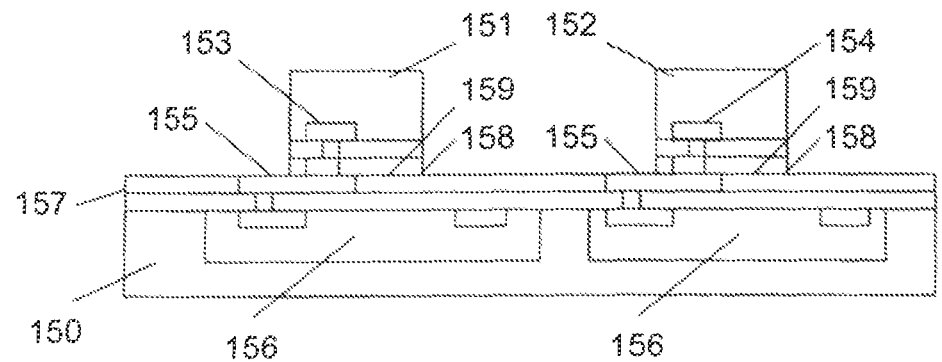
FIG. 15 illustrates metal to metal bonding of a plurality of devices to a larger substrate.

FIG. 15 shows metal bonding of smaller devices or die 151 and 152 to a single larger substrate 150. Structures 153 and 154 in devices 151 and 152, respectively, may be active devices or contact structures. Structures 156, which may also be or contain active devices, in substrate 150 have contact structures 155. A bond is formed at interface 159 between bonding layer 157 on substrate 150 and bonding layers 158 on the smaller devices 151 and 152.

The metal direct bonding offers numerous advantages including elimination of die grinding and thinning, via etching and metal deposition to form electrical interconnections to interconnect bonded wafers as described in the referenced art. This eliminates any mechanical damage caused by these die grinding and thinning. Further, the elimination of deep via etching avoids step coverage problems, allows the process to be scaled to smaller dimensions, resulting in smaller via plugs to contact bonded wafers. The method is compatible with other standard semiconductor processes, and is VLSI compatible.

Figure 16A:
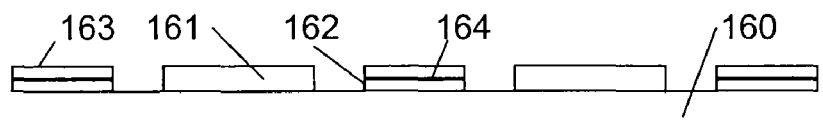
FIGS. 16A-16E illustrate an application of the invention to hermitic encapsulation.
Figure 16B:
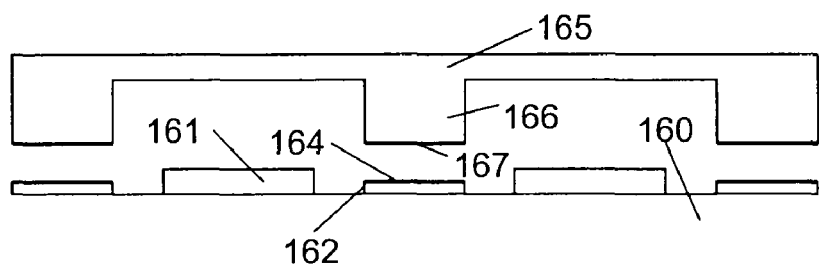
Figure 16C:
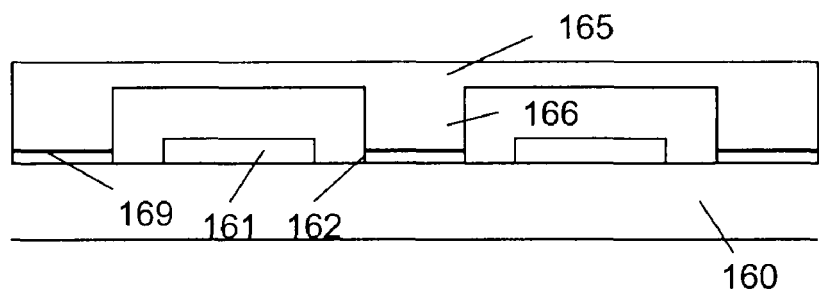
Figure 16D:
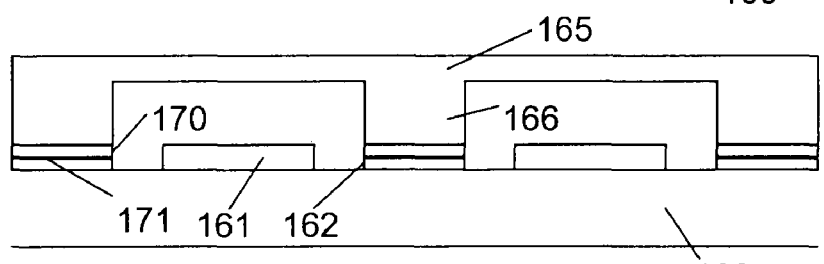
Figure 16E:
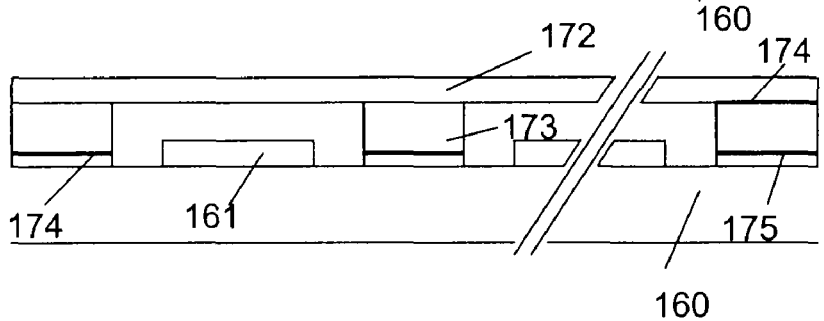

In a further example, the method of the invention can be applied to hermitic encapsulation as shown in FIGS. 16A-16E. A fluorinated bonding layer 162 is formed on the carrier, and protected during the formation of a device 161 such as a MEMS. FIG. 16A shows the steps of forming bonding layer 162 on carrier 160, followed by forming protective film 163 on bonding layer 162, and forming device 161 on carrier 160. As an example, carrier 160 could be a silicon substrate and bonding layer 162 could be a deposited oxide layer having the appropriate surface roughness and planarity characteristics to facilitate room temperature bonding. As shown in FIG. 16B, film 163 has been removed after the formation of device 161, and a cover 165 having portions 166 with surfaces 167, prepared with the appropriate surface roughness and planarity characteristics, in position to be bonded to surface 164 of bonding layer 162. Surface 167 is brought into direct contact with surface 164 and bonded, to form bond 169 as shown in FIG. 16C. FIG. 16D represents a modification of the method shown in FIGS. 16A-16C where bonding layer 170 is formed on portions 166, with appropriate surface and planarity characteristics. The surface of film 170 is brought into contact with surface of film 162 and bonded to form bond 171. Another modification of the method shown in FIGS. 16A-16C is illustrated in FIG. 16E, where the cover consists of plate 172 and portions 173 formed on plate 172. The surfaces of portions 173 are prepared as discussed above, and bonded to film 162 to form bond 174. The right hand portion of FIG. 16E shows a further modification where portion 173 is bonded to plate 172 with film 174 and to the surface of layer 162 to form bond 175. In either instance, portion 173 could be an oxide or silicon material, and plate 172 could be a silicon plate.

According to the present invention, silicon dioxide formed by any method such as deposition, sputtering, thermally or chemically oxidation, and spin-on glass, can be used in pure or doped states.

In a preferred embodiment of the present invention, an ammonia solution dip of wafers covered by fluorinated surface silicon dioxide layers, after hydration and prior to bonding, significantly increases the bonding energy at room temperature due to the formation of Si—N bonds and hydrogen.

An HF-dip and post-HF baking can produce localized covalent bonding at a desirable location on the wafer such as in an etched window in the silicon dioxide layer. Alternatively F implantation and subsequent annealing can produce localized covalent bonding at desirable locations.

According to the present invention, the HF-dip and post-HF baking can form low k dielectric locally in silicon dioxide layers. For instance, low k dielectric can be formed between the metal lines but not at the via level in multi-layer interconnects in VLSI devices.

The method of the invention is applicable to any type of substrate, such as heat sinks, handler or surrogate substrates, substrates with active devices, substrates with integrated circuits, etc. Substrates of different technologies, i.e. silicon, III-V materials, II-VI materials, etc. may be used with the invention.

Applications of the present invention include but are not limited to vertical integration of processed integrated circuits for 3-D SOC, micro-pad packaging, low-cost and high-performance replacement of flip chip bonding, wafer scale packaging, thermal management and unique device structures such as metal base devices.

Numerous modifications and variations of the present invention are possible in light of the above teachings. It is therefore to be understood that within the scope of the appended claims, the invention may be practiced otherwise than as specifically described herein.

The invention claimed is:

1. A bonded structure, comprising:
   first and second elements; and
   first and second fluorinated oxide bonding layers respectively formed on said first and second elements,
   a first surface of said first fluorinated oxide bonding layer bonded in direct contact with a second surface of said second fluorinated oxide bonding layer,
   each of said first and second surfaces contains fluorine, and
   at least one of said first and second bonding layers contains a fluorine concentration having a first peak near an interface of said first and second bonding layers and a second peak separated from said first peak.

2. A structure as recited in claim 1, wherein:
at least one of said first and second bonding layers comprises an oxide implanted with fluorine to a dose between $1\times10^{15}$ to $1\times10^{16}$ cm$^{-2}$.

3. A structure as recited in claim 1, wherein:
at least one of said first and second bonding layers has a fluorine concentration greater than $10^{17}$ cm$^{-3}$.

4. A structure as recited in claim 1, wherein:
at least one of said first and second bonding layers comprises a silicon oxide layer having an SiOF surface layer.

5. A structure as recited in claim 1, wherein:
at least one of said first and second bonding layers comprises a silicon oxide layer exposed to a plasma containing one of $CF_4$ and $SF_6$.

6. A structure as recited in claim 1, wherein:
at least one of said first and second bonding layers comprises an oxide layer deposited using a gas containing F.

7. A structure as recited in claim 1, wherein:
at least one of said first and second bonding layers comprises a first oxide layer disposed on a second oxide layer;
said at least one of said first and second bonding layers contains a fluorine concentration having a first peak at an interface of said first and second bonding layers and a second peak at an interface between said first and second oxide layers.

8. A structure as recited in claim 1, comprising:
said first element having a first metal pad formed in said first bonding layer;
said second element having a second metal pad formed in said second bonding layer; and
said first metal pad directly connected to said second metal pad.

9. A structure as recited in claim 1, comprising:
said first element having a plurality of first metal pads formed in said first bonding layer;
said second element having a plurality of second metal pad formed in said second bonding layer; and
said first metal pads directly connected to respective ones of said second metal pads.

10. A structure as recited in claim 1, wherein:
said first element comprises a carrier having a device; and
said second element comprises an encapsulating member,
said first and second elements bonded via said first and second bonding layers to encapsulate said device.

11. A bonded structure, comprising:
a first substrate and a second substrate;
a first bonding layer formed directly on one of said first substrate and said second substrate;
a second bonding layer formed directly on the other of said first substrate and said second substrate;
said first bonding layer bonded in direct contact with said second bonding layer,
said first bonding layer comprising fluorinated silicon oxide, and
said first bonding layer contains a fluorine concentration having a first peak near an interface of said first and second bonding layers a second peak separated from said first peak.

12. A structure as recited in claim 11, wherein:
said first bonding layer comprises an oxide implanted with fluorine to a dose between $1\times10^{15}$ to $1\times10^{16}$ cm$^{-2}$.

13. A structure as recited in claim 11, wherein:
said first bonding layer has a fluorine concentration greater than $10^{17}$ cm$^{-3}$.

14. A structure as recited in claim 11, wherein:
said first bonding layer comprises a silicon oxide layer having an SiOF surface layer.

15. A structure as recited in claim 11, wherein:
said first bonding layer comprises a silicon oxide layer exposed to a plasma containing one of $CF_4$ and $SF_6$.

16. A structure as recited in claim 11, wherein:
said first bonding layer comprises an oxide layer deposited using a gas containing F.

17. A structure as recited in claim 11, wherein:
said first bonding layer comprises a first oxide layer disposed on a second oxide layer;
said first bonding layer contains a fluorine concentration having a first peak at an interface of said first and second bonding layers and a second peak at an interface between said first and second oxide layers.

18. A structure as recited in claim 11, comprising:
said first substrate having a first metal pad formed in said first bonding layer;
said second substrate having a second metal pad formed in said second bonding layer; and
said first metal pad directly connected to said second metal pad.

19. A structure as recited in claim 11, comprising:
said first substrate having a plurality of first metal pads formed in said first bonding layer;
said second substrate having a plurality of second metal pads formed in said second bonding layer; and
said first metal pads directly connected to respective ones of said second metal pads.

20. A structure as recited in claim 11, wherein:
said first substrate comprises a carrier having a device; and
said second substrate comprises an encapsulating member,
said carrier bonded to said member via said first and second bonding layers to encapsulate said device.

21. A structure as recited in claim 11, wherein:
said second bonding layer comprises fluorinated silicon oxide.

22. A bonded structure, comprising:
an element comprising a silicon substrate;
a silicon oxide bonding layer having an SiOF surface layer directly disposed on said element; and
a silicon substrate directly bonded to said SiOF surface layer.

23. A structure as recited in claim 22, wherein:
said silicon oxide bonding layer comprises a silicon oxide layer implanted with fluorine to a dose between about $1\times10^{15}$ to $1\times10^{16}$ cm$^{-2}$.

24. A structure as recited in claim 22, wherein:
said SiOF surface layer has a fluorine concentration greater than $10^{17}$ cm$^{-3}$.

25. A structure as recited in claim 22, wherein:
said silicon oxide bonding layer comprises a silicon oxide layer exposed to a plasma containing one of $CF_4$ and $SF_6$.

26. A structure as recited in claim 22, wherein:
said SiOF surface layer comprises an oxide layer deposited using a gas containing F.

27. A structure as recited in claim 22, wherein:
said silicon oxide bonding layer comprises a silicon oxide layer exposed to HF.

28. A structure as recited in claim 22, comprising:
said element having a first metal pad formed in said first bonding layer;
said substrate having a second metal pad formed in said second bonding layer; and said first metal pad directly connected to said second metal pad.

29. A structure as recited in claim 22, comprising:

said element having a plurality of first metal pads formed in said first bonding layer;

said substrate having a plurality of second metal pads formed in said second bonding layer; and said first metal pads directly connected to respective ones of said second metal pads.

* * * * *